United States Patent
Chen et al.

(10) Patent No.: US 6,177,297 B1
(45) Date of Patent: Jan. 23, 2001

(54) METHOD OF FORMING METALLIC FUSE DEMANDING LOWER LASER POWER FOR CIRCUIT REPAIR

(75) Inventors: Jacob Chen, Hsinchu; Wen-Jeng Lin, Pan-Chiao, both of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/227,953

(22) Filed: Jan. 11, 1999

(51) Int. Cl.[7] .................................................. H01L 21/82
(52) U.S. Cl. ............................................................ 438/132
(58) Field of Search .................................. 438/4, 12, 13, 438/128, 129, 130, 131, 132

(56) References Cited

U.S. PATENT DOCUMENTS 5,025,300 * 6/1991 Billig et al. ........................... 257/529
5,578,517 * 11/1996 Yoo et al. ............................. 438/601
5,641,701 * 6/1997 Fukuhara et al. ........................ 438/6

* cited by examiner

Primary Examiner—Charles Bowers
Assistant Examiner—Keith Christianson

(57) ABSTRACT

An improved formation method produces a metallic fuse capable of lowering the laser power needed for carrying out circuit repair. The method includes forming a metallic fuse when the penultimate metallic layer is formed. Since the metallic fuse is not too far away from the top surface, the power of the laser beam necessary for repairing the circuit can be moderate. Furthermore, the laser beam is more focused because it travels a shorter distance to reach the fuse, thereby avoiding unnecessary dispersion through intermediate material. Moreover, since the metallic fuse itself is not too thick, only a low-power laser beam is needed to melt the metallic fuse.

13 Claims, 5 Drawing Sheets

METHOD OF FORMING METALLIC FUSE DEMANDING LOWER LASER POWER FOR CIRCUIT REPAIR

BACKGROUND OF THE INVENTION

1. Field of Invention

The present invention relates to a method of forming a metallic fuse. More particularly, the present invention relates to a method of forming a metallic fuse that demands a lower laser power for circuit repair.

2. Description of Related Art

In the manufacturing of semiconductor memories, product yield is of great importance. If there is one or more defective memory cells in a semiconductor memory product, the finished product as a whole is defective and has to be scrapped or repaired. As the level of device integration increases. the number of defective memory cells also increases proportionately. In other words, as the level of integration of semiconductor memory devices increases, product yield is correspondingly lowered.

As advanced techniques for fabricating semiconductor memory devices develop, the packing density of memory devices increases considerably. Consequently, fabrication becomes increasingly difficult and complex. Since impure particles (or fragments) appear when the memory devices are produced, a lower yield rate for highly integrated circuits is unavoidable. Hence, to increase the yield rate of circuit fabrication, redundant backup devices are often added to boost the product yield of conventional operations. Besides memory cell array for storing binary bits, an additional backup memory cell array is often provided so that defective memory cells can be easily replaced. Each redundant memory cell is connected to a word line and a bit line, respectively. Thus, even if more than a thousand defective memory cells are found after inspection, the defective memory cells can be replaced by the redundant memory cells in the backup array. Consequently, a defect-free memory array can be obtained on a silicon chip.

The above scheme of using redundant elements in memory circuits has the advantages of a higher yield and defect-free circuits. However, in exceptional cases, when the number of defective elements is higher than the number of redundant elements provided, even this scheme does not work.

In general, the above scheme is implemented by forming a redundant memory cell array around a main memory cell array when the semiconductor memory devices are manufactured. The main memory cell array and the redundant memory cell array are normally linked by polysilicon fuses, which can be melted away by a laser beam or a high current. When a defective memory cell needs to be fixed, the protective fuse is broken by a laser beam or an electric current. On the other hand, if the defective cell does not require fixing. the protective fuse can stay as it is.

FIGS. 1A and 1B are schematic, cross-sectional views showing the progression of manufacturing steps in forming a conventional polysilicon fuse.

First, as shown in FIG. 1A, a local oxidation of silicon (LOCOS) method is used to form a field oxide layer 12 over a semiconductor substrate 10. Then, the field oxide layer 12 is patterned to form an active region 13. Next, a polysilicon fuse structure 14 is formed above the field oxide layer 12. Thereafter, an inter-metal dielectric layer 16 is formed covering the entire substrate structure. including the polysilicon fuse 14. Subsequently, photolithographic and etching techniques are used to form an opening 17 in the inter-metal dielectric layer 16 that exposes a portion of the active region 13. Next, a conductive plug 18 is formed inside the opening 17, and then a layer of conductive material is deposited over the inter-metal dielectric layer 16 and makes electrical contact with the conductive plug 18. The conductive material is patterned to form a conductive layer 20.

Similarly, using the above method, another inter-metal dielectric layer 22 is formed over the conductive layer 20. Next, photolithographic and etching operations are again used to form another opening 24 in the inter-metal dielectric layer 22 and expose a portion of the conductive layer 20. Thereafter, another conductive plug 26 is formed inside the opening 24, and then a conductive material is formed over the inter-metal dielectric layer 22 and makes electrical contact with the conductive plug 26. The conductive material is patterned to form a conductive layer 28.

Next, a chemical-vapor deposition method is used to form a silicon nitride layer over the entire substratte structure that includes the conductive layer 28. The silicon nitride layer 30 serves as a protective layer in subsequent operations. Thereafter, conventional photolithographic and etching methods are used to pattern the silicon nitride layer 30 so that an opening 32 is formed in the silicon nitride layer 30. The opening 32 exposes a portion of the inter-metal dielectric layer 22. Moreover, the opening 32 is formed in a location vertically above the polysilicon fuse structure 14.

Next, as shown in FIG. 1B, when a defective memory cell needs to be reinstated, the polysilicon fuse 14 of that particular cell has to be cut by a laser beam. Consequently, the defective memory cell is replaced by a redundant memory cell. In the laser cutting operation, the laser beam penetrates the opening 32 and passes through the inter-metal dielectric layers 16 and 22 to reach the polysilicon fuse 14, deep below, hence cutting open the luse connection and achieving the necessary defective cell replacement. Since the laser beam's power is very high, portions of the inter-metal dielectric layers 16 and 22 penetrated by the laser beam sublimate and turn into gas. Ultimately, a deep opening 34 that exposes the field oxide layer 12 is be formed when the memory cell restoration is completed.

However, in the conventional method of fabricating polysilicon fuses, the fuses are still laid on top of the field oxide layer even though there are more than three intervening inter-metal dielectric layers. Since the polysilicon fuses are too deep below the surface, the laser beam's power must be very high in order for it to carry out the reparation. Furthermore, when the polysilicon fuses are too deep within the structure, it is difficult for the laser beam to reach the fuse without part of the laser beam being dispersed. Hence. much laser power is wasted and yield of the reparation is low.

In practice, when the laser power used in burning a polysilicon fuse is between $2 \times 10^{-6}$ to $3 \times 10^{-6}$ joules/sec, the rate of repair is 50% at most. If a higher rate of repair is desired, the laser power output has to be increased to an even higher value. However, turning up the laser power can easily damage part of the silicon wafer.

In light of the foregoing, there is a need to provide a method of forming a polysilicon fuse that requires less laser power to achieve the desired result.

SUMMARY OF THE INVENTION

Accordingly, the present invention provides a method of forming a metallic fuse capable of lowering the laser power necessary for performing a memory cell replacement operation.

To achieve these and other advantages and in accordance with the purpose of the invention, as embodied and broadly described herein, the invention provides a method of forming a metallic fuse that permits use of a less powerful laser for memory cell repair. The method comprises the steps of providing a substrate having a field oxide layer that defines an active region already formed thereon. Then, a first conductive layer and a metallic fuse are formed over the substrate, wherein the first conductive layer is electrically coupled to the active region. Next, a dielectric layer is formed over the first conductive layer and the metallic fuse. Thereafter, a second conductive layer is formed above the dielectric layer. Subsequently, a protective layer having an opening is formed over the second conductive layer and the dielectric layer. The opening is positioned vertically above the metallic fuse. Finally, the metallic fuse is burned by a laser beam to open the electrical connection when a memory cell repair is necessary.

One aspect of this invention is the formation of a metallic fuse when the penultimate metallic layer is formed. In other words, the metallic fuse is at the same level as the penultimate metallic layer. Consequently, the metallic fuse is not too far from the top surface, and the laser power necessary to burn the fuse is moderate. Since the laser beam is focused within a short distance, problems such as dispersion that can affect the rate of repair are avoided.

Furthermore, the last metallic layer deposited on top of a substrate structure is usually very thick. However, the metallic fuse of this invention is not formed together with the very last metallic layer, therefore the metallic fuse is only moderately thick. Consequently, laser power needed for melting the fuse is low. The silicon wafer is not be so easily damaged with a low-power laser beam.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
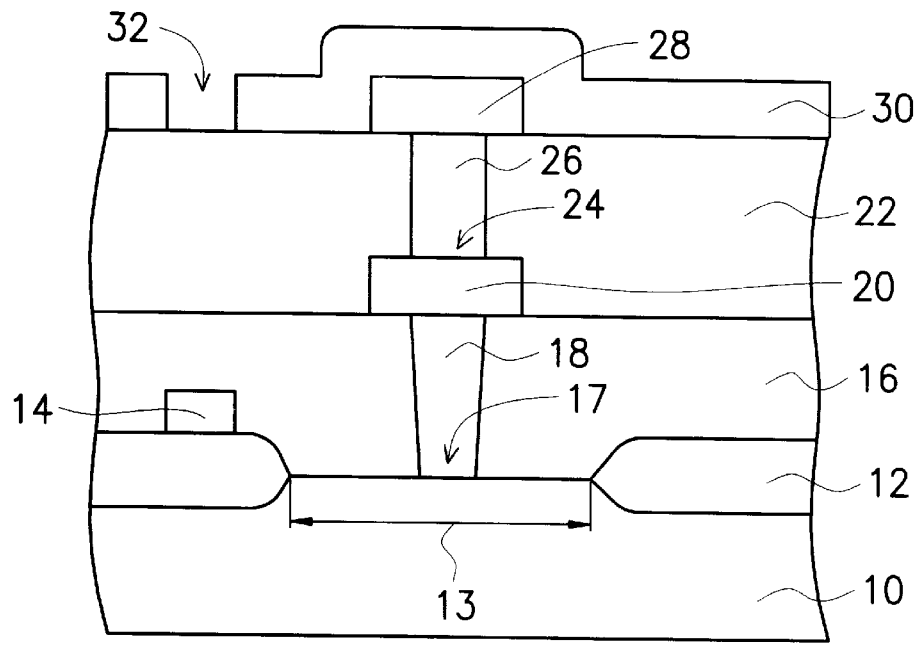
FIGS. 1A and 1B are schematic, cross-sectional views showing the progression of manufacturing steps in forming a conventional polysilicon fuse.
Figure 1B:
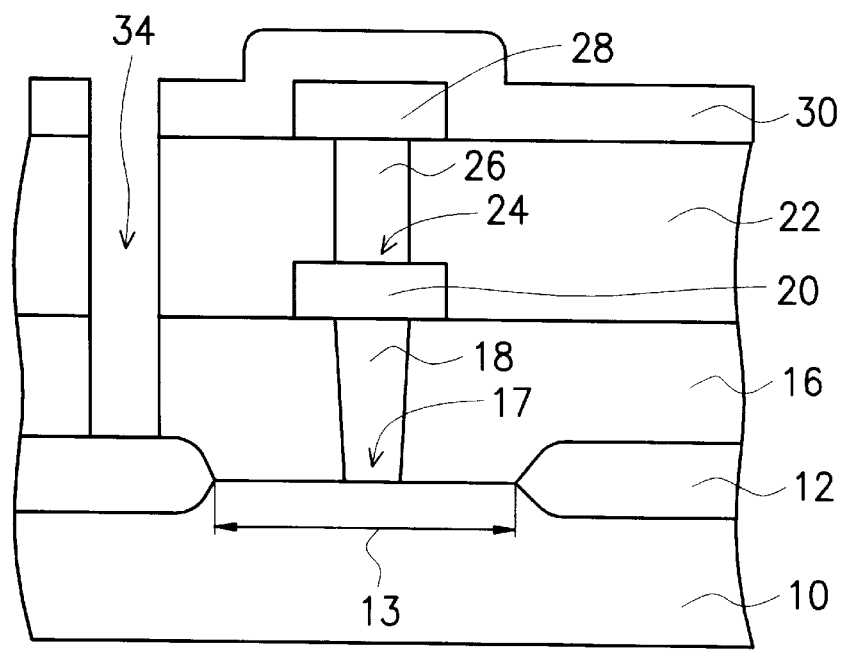

Reference will now be made in detail to the present preferred embodiments of the invention, examples of which are illustrated in the accompanying drawings. Wherever possible, the same reference numbers are used in the drawings and the description to refer to the same or like parts.

Figure 2A:
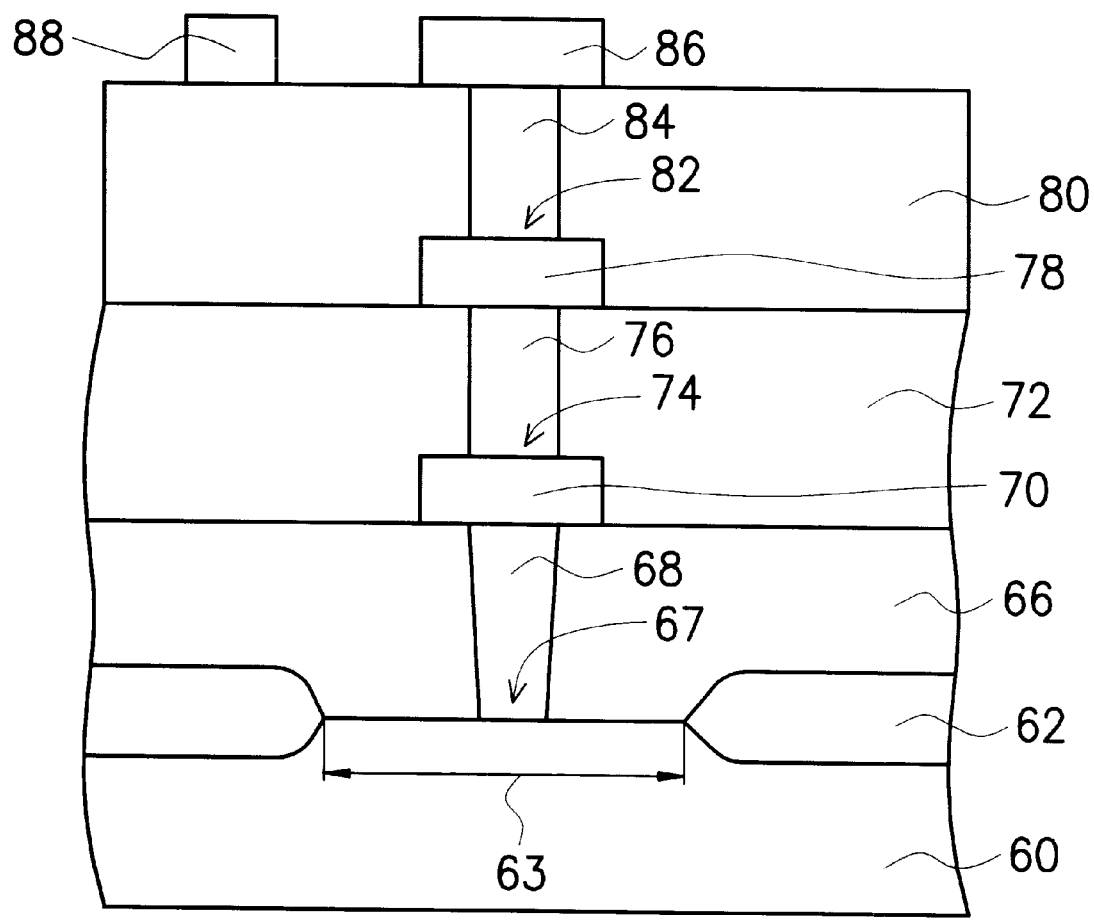
FIGS. 2A through 2C' are schematic, cross-sectional views showing the progression of manufacturing steps in forming a polysilicon fuse capable of lowering the necessary laser power for circuit repair according to one preferred embodiment of this invention.
Figure 2B:
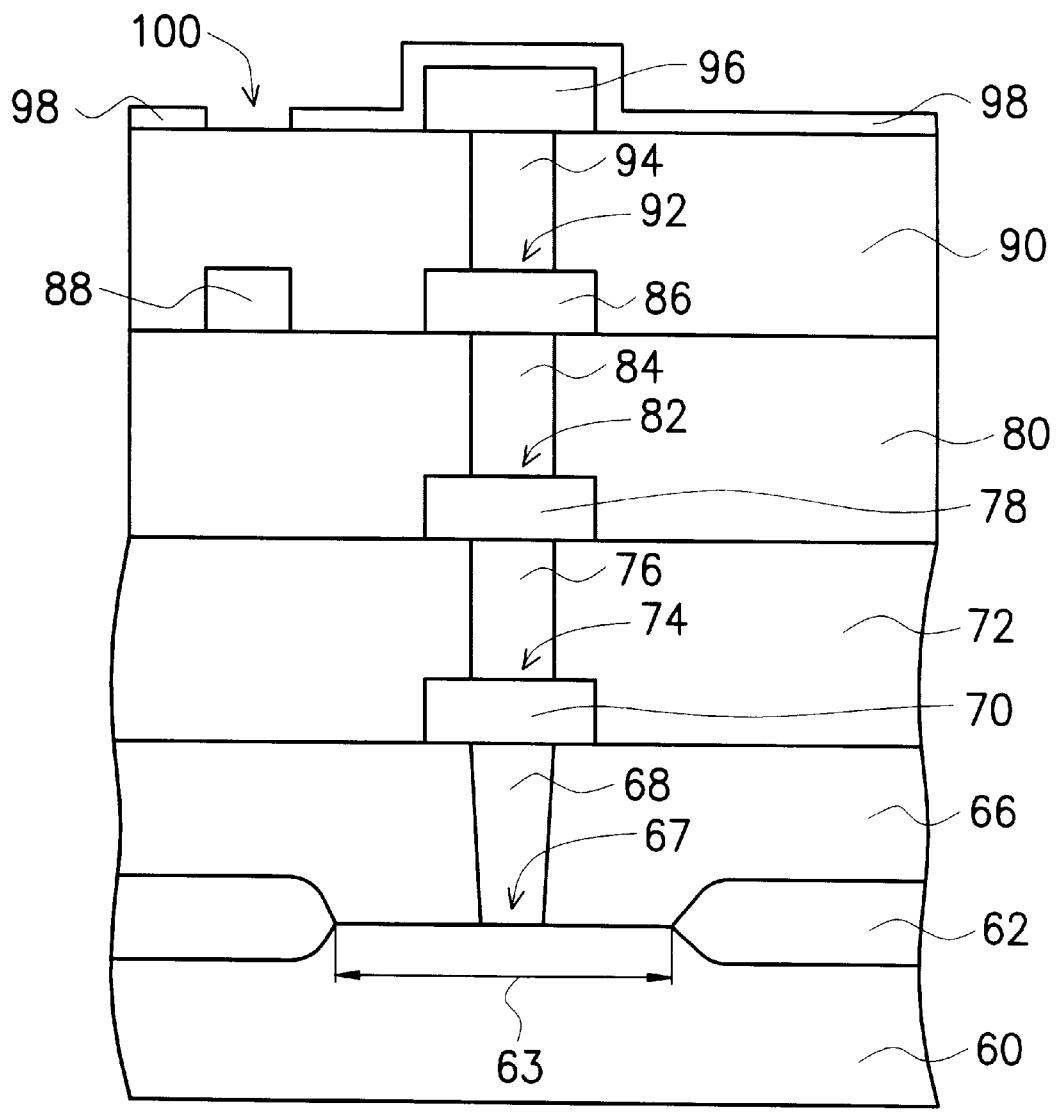
Figure 2C:
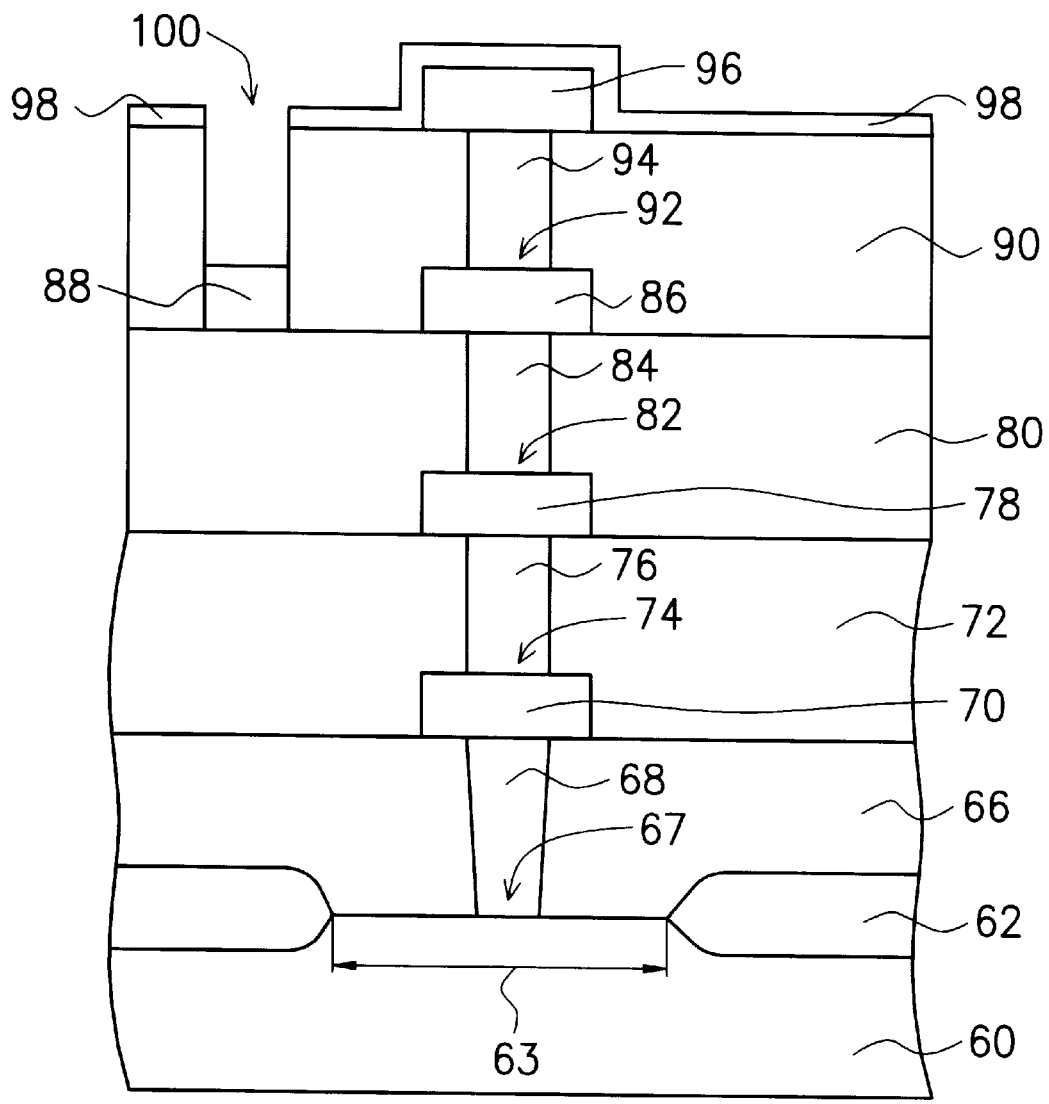
Figure 2C:
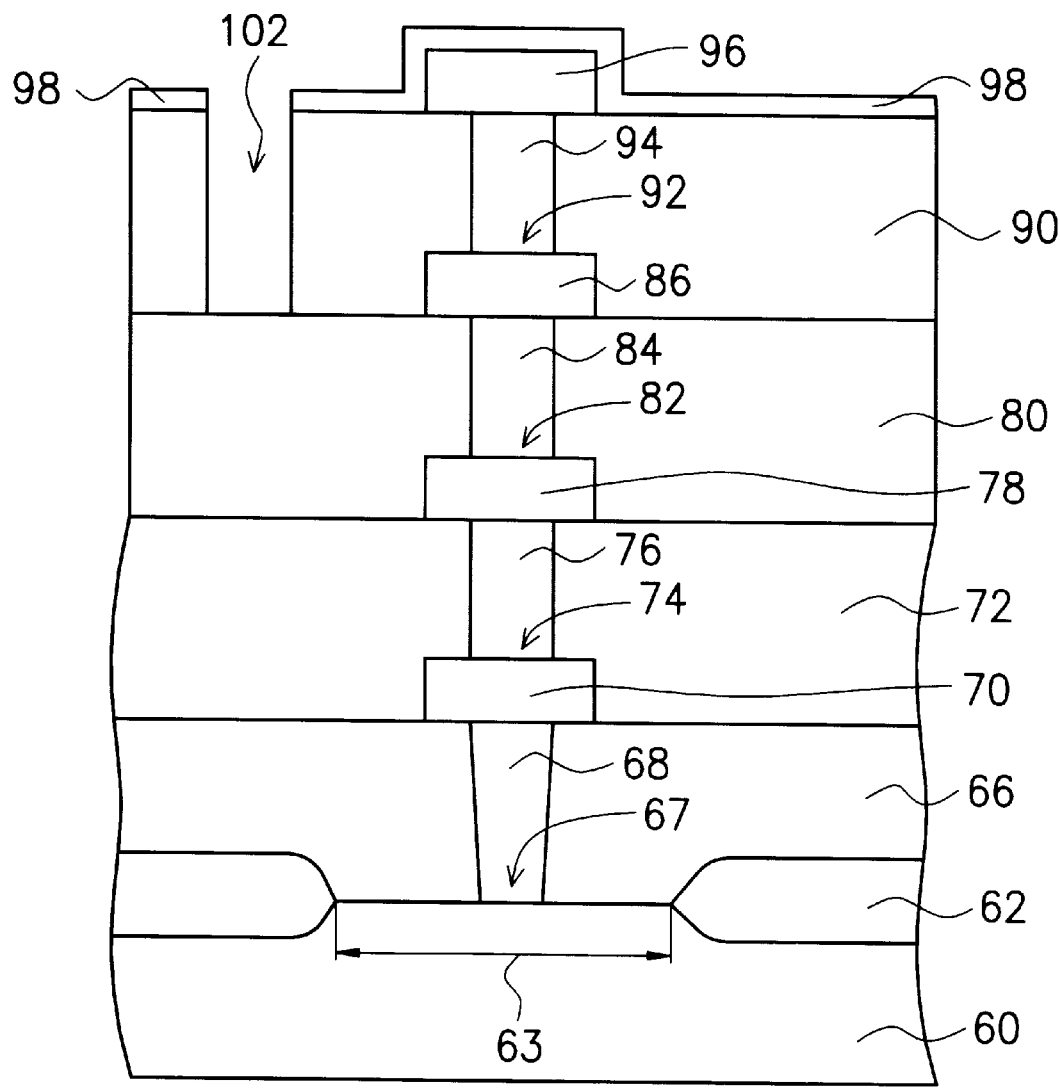

FIGS. 2A through 2C' are schematic, cross-sectional views showing the progression of manufacturing steps in forming a polysilicon fuse capable of lowering the necessary laser power for circuit repair according to one preferred embodiment of this invention.

First, as shown in FIG. 2A, a local oxidation of silicon (LOCOS) method is used to form a field oxide layer 62 above a semiconductor substrate 60. The field oxide layer 62 defines an active device region 63. Next, an inter-metal dielectric layer 66 is formed and covers the entire substrate structure. Thereafter, photolithographic and etching techniques are used to form an opening, 67 in the inter-metal dielectric layer 66 such that opening 67 exposes the active region 63. Subsequently, a conductive plug 68 is formed inside the opening 67. Then, a conductive material is formed over the inter-metal dielectric layer 66 and makes electrical contact with the conductive plug 68. Ultimately, the layer of conductive material is patterned to form a conductive layer 70.

Next, methods similar to the above are used again. First, an inter-metal dielectric layer 72 is formed covering the conductive layer 70 and the inter-metal dielectric layer 66. Thereafter, photolithographic and etching techniques are used to form an opening 74 in the inter-metal dielectric layer 72 such that opening 74 exposes the conductive layer 70. Subsequently, a conductive plug 76 is formed inside the opening 74, and then a layer of conductive material is formed over the inter-metal dielectric layer 72 and makes electrical contact with the conductive plug 76. Then, the layer of conductive material is patterned to form a conductive layer 78.

Next, another inter-metal dielectric layer 80 is formed over the entire semiconductor structure including the conductive layer 78. Then, photolithographic and etching techniques are again used to form an opening 82 in the inter-metal dielectric layer 80 such that opening 82 exposes the conductive layer 78. Next, a conductive plug 84 is formed inside the opening 82. Subsequently, a layer of conductive material is deposited over the inter-metal dielectric layer 80 and covers the conductive plug 84, as well. Thereafter, the layer of conductive material is patterned to form a conductive layer 86 and a metallic fuse 88.

Next, as shown in FIG. 2B, another inter-metal dielectric layer 90 is formed over the conductive layer 86, the metallic fuse 88 and the inter-metal dielectric layer 80. Then, photolithographic and etching techniques are again used to form an opening 92 in the inter-metal dielectric layer 90 such that opening 92 exposes the conductive layer 86. Next, a conductive plug 94 is formed inside the opening 92. Subsequently, a layer of conductive material is deposited over the inter-metal dielectric layer 90 and covers the conductive plug 94, as well. Thereafter, the layer of conductive material is patterned to form a conductive layer 96.

Next, a chemical vapor deposition method is used to form a silicon nitride layer 98 over the entire substrate structure including the conductive layer 96. The silicon nitride layer 98 serves as a protective layer to prevent any damaging effect of a laser beam on other devices on the semiconductor structure. Thereafter, conventional photolithographic and etching techniques are used to pattern the silicon nitride layer 98 and form an opening 100. The opening 100 exposes a portion of the inter-metal dielectric layer 90, and is located vertically above the metallic fuse 88.

Next, as shown in FIG. 2C, when a defective memory cell needs to be reinstated, the metallic fuse 88 has to be cut open by a laser beam so that a redundant memory cell can replace the defective cell. In the restoration process, a laser beam is shone through the opening 100 and penetrates through the inter-metal dielectric layer 90 until the metal fuse 88 is reached. Since the laser beam is a source of high energy, a portion of the inter-metal dielectric layer 90 sublimates and turn into gas. When the laser beam reaches the metallic fuse 88. the fuse is melted away. Therefore, an opening 102 that exposes the inter-metal dielectric layer 80 is formed after the repair operation, as shown in FIG. 2C'.

One aspect of this invention is the formation of the metallic fuse 88 when the first metallic layer 86 below the top metallic layer 96 is formed. In other words, the metallic fuse 88 is at the same level as the penultimate metallic layer 86. Consequently, the metallic fuse 88 is not too far from the top surface, and the laser power necessary for burning the fuse 88 is moderate. Since the laser beam remains focused within a short distance problems such as dispersion that can affect the rate of repair are avoided.

Furthermore the last metallic layer 96 on top is generally very thick. However, since the metallic fuse 88 of this invention is not formed together with the very last metallic layer 96, thickness of the metallic fuse 88 is only moderate. Consequently, laser power needed for melting the fuse can be low. With a low-power laser beam, a silicon wafer is not so easily damaged.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a metallic fuse capable of lowering the laser power necessary for circuit reparation, the method comprising the steps of:

providing a substrate having a field oxide layer that defines an active device region already formed thereon;

forming a first conductive structure and a metallic fuse above the substrate, wherein the first conductive structure is electrically coupled to the active device region;

forming a dielectric layer on the first conductive structure and the metallic fuse;

forming a second conductive structure over the dielectric layer, wherein the second conductive structure contains a conductive pad and a conductive plug, and the conductive pad is electrically coupled with the first conductive structure through the conductive plug;

forming a protective layer over the substrate to cover the second conductive structure and the dielectric layer;

forming an opening in the protective layer, wherein the opening is aligned with the position of the metallic fuse without exposing the second conductive structure; and carrying out a circuit repair operation using a laser beam.

2. The method of claim 1, wherein the second conductive layer represents a topmost interconnect structure.

3. The method of claim 1. wherein the step of forming the protective layer includes a chemical vapor deposition method.

4. The method of claim 1, wherein before the step of forming the first conductive structure, further includes sequentially forming a stack containing a plurality of interconnect structures above the substrate.

5. The method of claim 4, wherein the first conductive structure is formed so that it is electrically coupled to the interconnect structures.

6. The method of claim 4, wherein the interconnect structures are formed so that they are electrically coupled to the substrate.

7. The method of claim 4, wherein the first conductive structure is formed above the interconnect structures.

8. The method of claim 1, wherein the first conductive structure and the metallic fuse are formed in the same operation.

9. The method of claim 1, wherein the step of forming the protective layer includes depositing silicon nitride.

10. The method ol claim 1, wherein the step of carrying out the circuit repair includes melting away the metallic fuse using a laser beam.

11. The method of claim 1, wherein a thickness of the conductive pad is larger than a thickness of the fuse.

12. A method of forming a metallic fuse comprising the steps of:

providing a substrate having a field oxide layer that defines an active device region already formed thereon;

forming at least one first dielectric layer over the substrate covering the field oxide layer and the active device region;

forming a first conductive plug penetrating the first dielectric layer to electrically connect to the active device region;

forming a first conductive pad on the first dielectric layer, wherein the first conductive pad is electrically connected to the first conductive plug;

forming a second dielectric layer covering the first dielectric layer and the first conductive pad;

forming a first conductive structure and a metallic fuse over the second dielectric layer, wherein the first conductive structure penetrating the second dielectric layer and electrically connects to the first conductive pad;

forming a third dielectric layer over the first conductive structure and the metallic fuse;

forming a second conductive structure over the third dielectric layer, wherein the second conductive structure has a second conductive pad and a second conductive plug, and the second conductive pad is electrically connected to the first conductive structure through the second conductive plug;

forming a protective layer covering the second conductive pad and the third dielectric layer;

forming an opening in the protective layer, wherein the opening is aligned with the position of the metallic fuse; and carrying out a circuit repair operation using a laser beam.

13. The method of claim 12, wherein a thickness of the second conductive pad is larger than a thickness of the fuse.

* * * * *